United States Patent [19]

Nozu

[11] Patent Number: 5,387,808
[45] Date of Patent: Feb. 7, 1995

[54] HETEROJUNCTION BIPOLAR TRANSISTORS WITH SLOPED REGIONS

[75] Inventor: Tetsuro Nozu, Tokyo, Japan

[73] Assignee: Kabushiki Kaisha Toshiba, Kanagawa, Japan

[21] Appl. No.: 6,758

[22] Filed: Jan. 21, 1993

[30] Foreign Application Priority Data

Jan. 22, 1992 [JP] Japan .................. 4-009183

[51] Int. Cl.⁶ .............. H01L 29/73; H01L 27/102
[52] U.S. Cl. .................. 257/197; 257/198; 257/618; 257/622
[58] Field of Search ........... 257/197, 198, 618, 623, 257/622

[56] References Cited

U.S. PATENT DOCUMENTS 5,144,376  9/1992  Kweon ............... 257/197

FOREIGN PATENT DOCUMENTS 0187271  8/1986  Japan ................. 257/197

OTHER PUBLICATIONS

"MBE Growth of III-V compound heterostructures on Channeled GaAs Substrates", S. Shimomura et al., The Japan Society of Applied Physics and Related Societies, Extended Abstracts (The 39th Spring Meeting), p. 1261, 1992.

"MBE growth of GaAs/AlAs double-barrier structures on GaAs channeled substrates", S. Shimomura et al., Journal of Crystal Growth 111, pp. 1105-1109, 1991.

Primary Examiner—Robert P. Limanek
Assistant Examiner—Wael M. Fahmy
Attorney, Agent, or Firm—Finnegan, Henderson, Farabow, Garrett & Dunner

[57] ABSTRACT

The present invention is directed toward a heterojunction bipolar transistor integrated circuit in which the collector layers of two heterojunction bipolar transistors are provided on a semi-insulating substrate. The collector layers have at least one surface that is sloped relative to the substrate. Base layers are provided on the sloped portions a common emitter layer is provided in contact with the base layers. Alternatively, the common emitter layer is provided on the substrate and etched to form to sloped surface thereon. Base and collector layers are then formed on the sloped surfaces of the common emitter layer.

7 Claims, 5 Drawing Sheets

HETEROJUNCTION BIPOLAR TRANSISTORS WITH SLOPED REGIONS

BACKGROUND OF THE INVENTION

1. Field of the Invention

The present invention relates to a bipolar transistor, particularly to a heterojunction bipolar transistor.

2. Description of the Related Art

Recently, research and development of heterojunction bipolar transistors (HJBTs), which use a compound semiconductor, has been remarkable. However, it is still difficult to manufacture an integrated circuit having heterojunction bipolar transistors.

One problem is that characteristics of the HJBTs vary from transistor to transistor. For example, in an ECL (emitter coupled logic) integrated circuit, it is important that the pair of driver transistors that constitute a differential amplifier have uniform characteristics. If the characteristics of the transistors are non-uniform, a large current source is necessary to keep a wide operational margin. Accordingly, the deviation of the device characteristics leads to problems in implementation and fabrication of this type of integrated circuit.

A second problem is that it is difficult to further miniaturize HJBTs. Further miniaturization is important to realize high speed devices.

For example, the conventional HJBT may have a very small scale structure in the vertical direction, e.g., less than 10 nm. However, the length of the transistor in a horizontal direction is at least a few hundred nm due to limitations in lithography.

As explained above, the conventional heterojunction bipolar transistor has problems that make it difficult to manufacture a pair of transistors having uniform characteristics. In addition, it is difficult to form very small scale transistors, particularly in the horizontal direction.

SUMMARY OF THE INVENTION

A first object of the invention is to provide an integrated circuit heterojunction bipolar transistors having uniform characteristics. A second object of the invention is to provide a very small scale heterojunction bipolar transistor in the horizontal direction, which can be easily manufactured.

To attain the above objects of the invention, there is provided a semiconductor device which comprises a substrate; a first sloped semiconductor region having a first conductivity type formed on said substrate; a second sloped semiconductor region having the first conductivity type formed on said substrate; a third semiconductor region having a second conductivity type formed in contact with first sloped semiconductor region; a fourth semiconductor region having the second conductivity type formed in contact with said second sloped semiconductor region; a fifth semiconductor region having the first conductivity type formed in contact with said third semiconductor region and said fourth semiconductor region.

Moreover, in accordance with the present invention a semiconductor device is provided which comprises: a substrate having a primary surface; a first heterojunction bipolar transistor formed on the primary surface of said substrate including: a first layer having a first conductivity type, said first layer having a surface sloped relative to the primary surface of said substrate; and a second layer having a second conductivity type being formed on the sloped surface of said first layer; a second heterojunction bipolar transistor formed on the primary surface of said substrate including: a first layer having a first conductivity type, said first layer having a surface sloped relative to the primary surface of said substrate; and a second layer having a second conductivity type being formed on the sloped surface of said first layer; and a semiconductor region being formed on the primary surface of said substrate, said semiconductor region having a first portion in contact with said second layer of said first heterojunction bipolar transistor and a second portion in contact with said second layer of said second heterojunction bipolar transistor.

Further, in accordance with the present invention, a semiconductor device is provided which comprises: a substrate having a primary surface; a first heterojunction bipolar transistor including: a first layer having a first conductivity type; and a second layer having a second conductivity type being formed in contact with said first layer; a second heterojunction bipolar transistor including: a first layer having the first conductivity type; and a second layer having the second conductivity type being formed in contact with said first layer; an island semiconductor layer having the first semiconductor type and being formed on said semiconductor substrate, said island semiconductor layer having a first sloped surface and a second sloped surface, wherein the first sloped surface of said island semiconductor layer being formed in contact with said second layer of said first heterojunction bipolar transistor, the second sloped surface being formed in contact with said second layer of said second heterojunction bipolar transistor.

A method for manufacturing a semiconductor device is also provided in accordance with the present invention which comprises the steps of: forming a first layer on a substrate; forming a first sloped surface on said first layer; forming a second doped surface on said first layer; forming a second layer on at least a portion of said first sloped surface; forming a third layer on at least a portion of said second sloped surface; and forming a fourth layer in contact with the second and third layers.

BRIEF DESCRIPTION OF THE DRAWINGS

Other objects and advantages of the invention will be apparent from the following description, taken in conjunction with the accompanying drawings, in which.

DETAILED DESCRIPTION OF THE PREFERRED EMBODIMENTS

Figure 1A:
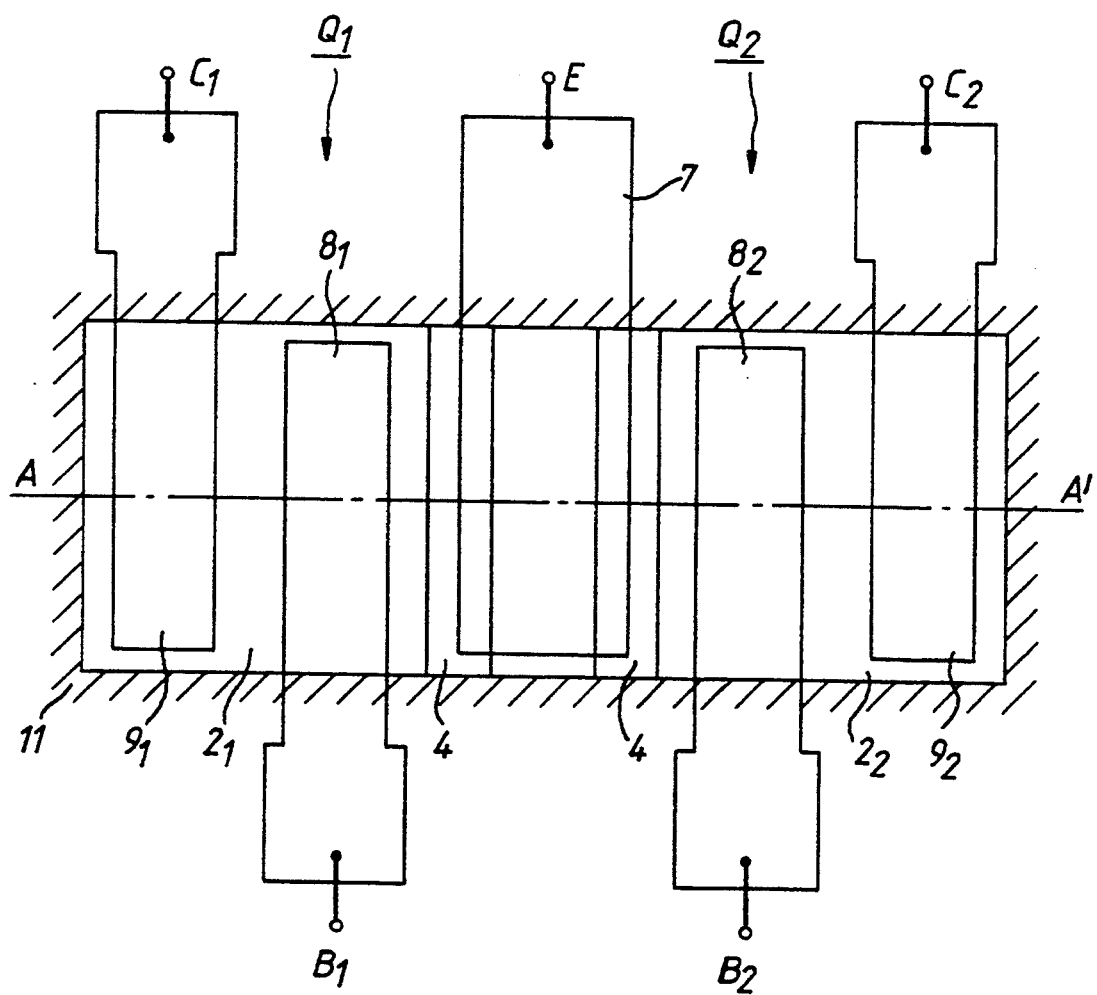
FIG. 1(a) is a plan view of a heterojunction bipolar transistor of a first embodiment according to the present invention.
Figure 1B:
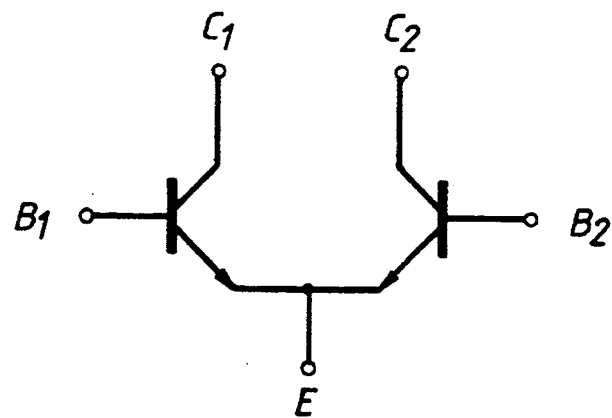
FIG. 1(b) is an equivalent circuit view of the first embodiment, FIG. 2 a cross-sectional view, along line A—A' in FIG. 1(a), FIGS. 3(a)-3(c) are sectional views at different steps in the process of fabricating a HJBT in accordance with the first embodiment.
Figure 2:
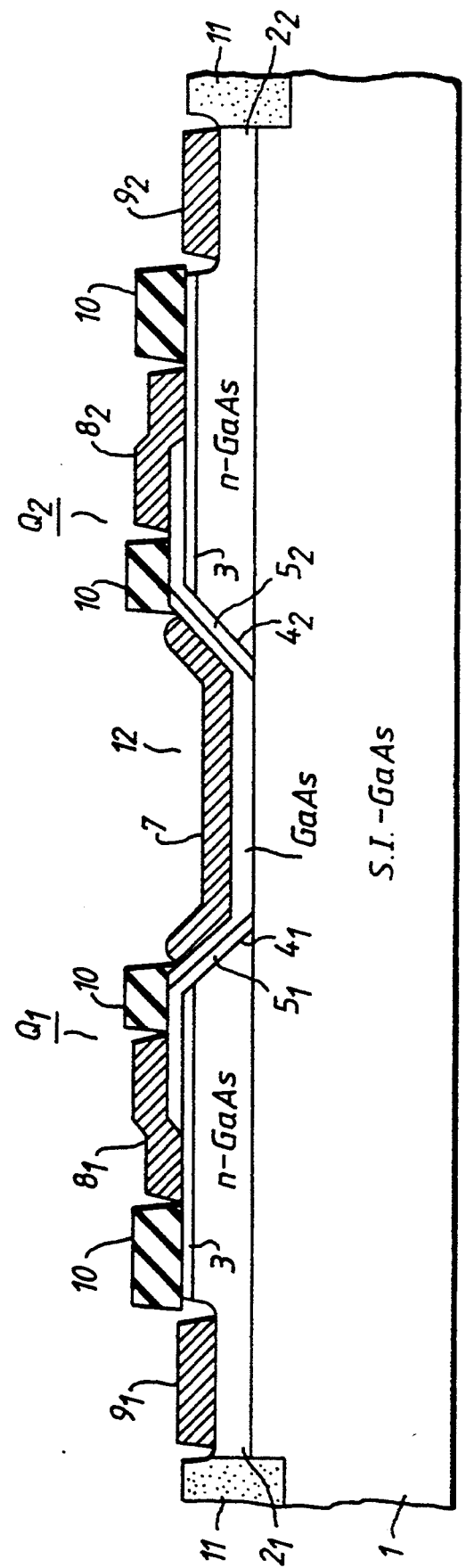

FIG. 1(a) shows a plan view of a pair of heterojunction bipolar transistors in accordance with the first embodiment of the present invention. FIG. 1(b) shows an equivalent circuit of the HJBT, shown in FIG. 1(a). FIG. 2 shows a cross-sectional view taken along line A—A' in FIG. 1(a).

As shown in FIG. 2, n type GaAs layers $2_1$ and $2_2$ formed on a semi-insulating GaAs substrate 1 are separated by an opening 12 having a depth sufficient to expose the surface of the GaAs substrate 1. Also, n type GaAs layers $2_1$ and $2_2$ are completely surrounded by a highly resistive layer 11 formed by a known ion implantation method. Heterojunction bipolar transistors $Q_1$ and $Q_2$ are respectively formed on the n type GaAs layers $2_1$ and $2_2$. Layers $2_1$ and $2_2$ serve as collectors of transistors $Q_1$ and $Q_2$ and are covered by an undoped (intrinsic type) GaAs layer 3 on a top surface thereof. Edge portions or side surfaces of n type GaAs layers $2_1$ and $2_2$ are defined by opening 12. Side surfaces $4_1$ and $4_2$ are not covered by GaAs layer 3 and are formed at an angle with respect to the surface of. GaAs substrate 1. That is, side surfaces $4_1$ and $4_2$ constitute inclined planes relative to the surface of GaAs substrate 1.

P type base layers $5_1$ and $5_2$ of HJBTs $Q_1$ and $Q_2$ are respectively formed on inclined planes $4_1$ and $4_2$, opposite each other. Base layers $5_1$ and $5_2$ are patterned to extend onto a part of collector layers $2_1$ and $2_2$. An n type AlGaAs layer 6, serving as a common emitter layer, is connected to both p type base layers $5_1$ and $5_2$. N-type AlGaAs layer 6 is formed on portions of base layers $5_1$ and $5_2$ that extend over inclined planes $4_1$ and $4_2$.

A common emitter electrode 7 contacts n type AlGaAs layer 6. Base electrodes $8_1$ and $8_2$ contact base layers $5_1$ and $5_2$. Collector electrodes $9_1$ and $9_2$ contact collector layers $2_1$ and $2_2$. An insulating layer 10 is formed between electrodes 7, $8_1$, $8_2$, $9_1$, and $9_2$ to electrically isolate these electrodes.

Figure 3A:
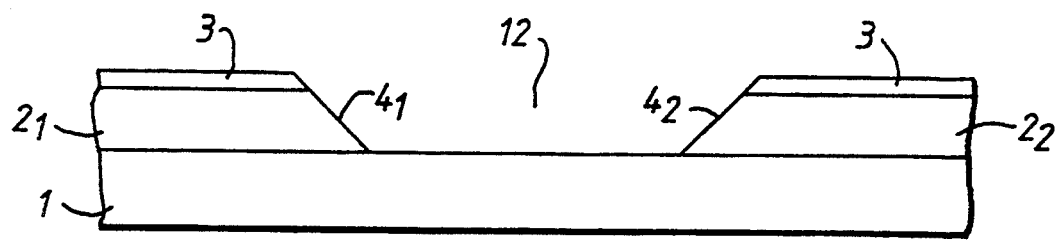
Figure 3B:
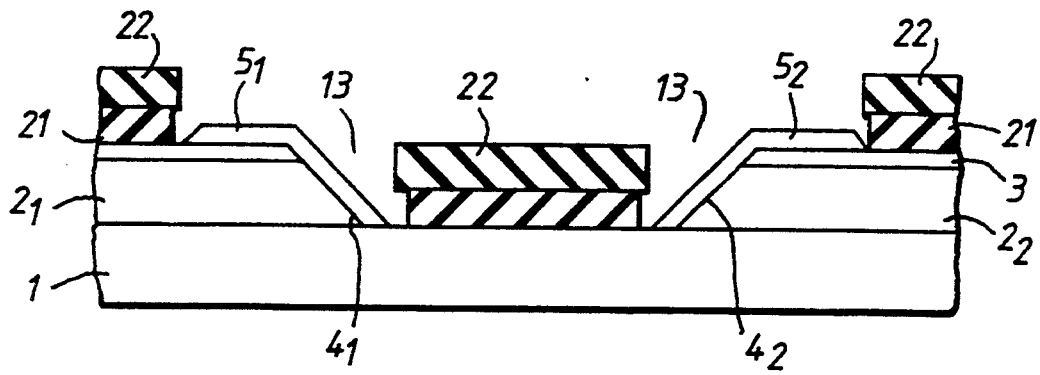
Figure 3C:
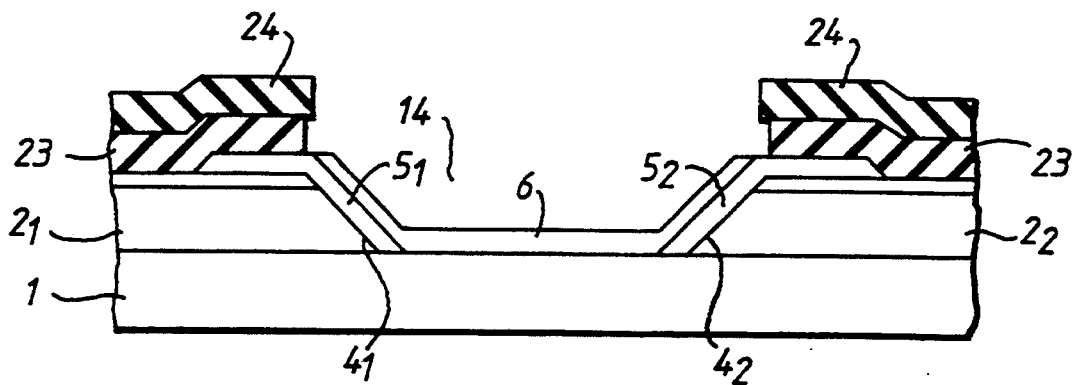

FIG. 3(a)–FIG. 3(c) show sectional views of the HJBTs described above at various stages during processing.

First, as seen in FIG. 3(a), n type GaAs layers $2_1$ and $2_2$, and an i type GaAs layer 3 are successively epitaxially grown on a semi-insulating GaAs substrate 1, by a known MBE (molecular beam epitaxy growth) method. N type GaAs layer $2_1$ and $2_2$ are doped with silicon and have a concentration $8 \times 10^{17}$/cm$^3$ of this impurity. Layers $2_1$ and $2_2$ have a thickness of 400 nm. I type GaAs layer has a thickness of 200 nm.

A highly resistive layer (not shown) is then formed in a predetermined field region by H+ ion implantation, to surround n type GaAs layers $2_1$ and $2_2$ which are formed in a device region.

As further shown in FIG. 3(a), layers $2_1$, $2_2$, and 3, surrounded by the field region, are separated to form two heterojunction bipolar transistor regions by a first opening 12, which is formed by a selective wet etch using a phosphoric acid liquid system.

The first opening is formed to have a depth sufficient to reach the surface of semi-insulating GaAs substrate 1. FIG. 3(a) shows a view along the [011] direction of n type GaAs layers $2_1$ and $2_2$.

The edge or side portions $4_1$ and $4_2$ of the two transistor regions, separated by opening 12, are formed at an angle with respect to the surface of the substrate. The angle is determined by the etching solution used and the material etched. In accordance with the first embodiment, layers $2_1$ and $2_2$ are made of GaAs and the etchant is a phosphoric acid liquid system. Further, in accordance with the first embodiment, the side portions of layers $2_1$ and $2_2$ are preferably sloped upward at an angle of 60° relative to the surface of the substrate. Although an anisotropic wet etch has been described above, a dry etching process may also be implemented to form side portions $4_1$ and $4_2$.

The width of the bottom portion of opening 12 is about 2 μm. N type GaAs layers $2_1$ and $2_2$ are divided by opening 12 and are formed as collectors for each of bipolar transistors $Q_1$ and $Q_2$.

As shown in FIG. 3(b), after SiO$_2$ layer 21 and Si$_3$N$_4$ layer 22 are successively formed on the whole surface of GaAs substrate 1 by a known CVD (chemical vapor deposition) method, second openings 13 are wet-etched by a known process to expose inclined planes $4_1$ and $4_2$ and a part of the edge portions of layers $2_1$ and $2_2$. In this step, the amount of side etching of SiO$_2$ layer 21 is controlled to be greater than that for Si$_3$N$_4$ layer 22, by taking advantage of the different etch rates of these materials. As a result, Si$_3$N$_4$ layer 22 is formed to overhang SiO$_2$ layer 21. In a subsequent step, by using layers 21 and 22 as a mask, p type GaAs base layers $5_1$ and $5_2$ are selectively epitaxially grown on exposed portions of GaAs collector layers $2_1$ and $2_2$ and i type GaAs layer 3. P type GaAs base layers $5_1$ and $5_2$ are formed by a MOCVD (metal organic chemical vapor deposition) method. I type GaAs layer 3 is provided to reduce the parasitic capacitance between collectors $4_1$ and $4_2$ and bases $2_1$ and $2_2$, respectively. P type GaAs base layers $5_1$ and $5_2$ are doped with beryllium and have a concentration $5 \times 10^{19}$/cm$^3$ of this impurity. Base layers $5_1$ and $5_2$ have a thickness of 100 nm. Extended or overlapping portions of base layers $5_1$ and $5_2$ on GaAs layer 3 serve as base electrode pulling out regions.

As shown in FIG. 3(c), SiO$_2$ layer 21 and Si$_3$N$_4$ layer 22 are removed, and then an SiO$_2$ layer 23 and an Si$_3$N$_4$ layer 24 are successively formed. Layers 23 and 24 are patterned to form a third opening 14 which exposes the first opening for subsequent formation of the emitter layer. An n type AlGaAs layer 6, serving as the emitter layer, is then selectively epitaxially grown by an MOCVD method. N type AlGaAs layer 6 is doped with silicon to a concentration of $5 \times 10^{18}$/cm$^3$ and has a thickness of 300 nm.

After AlGaAs layer 6 is formed, an emitter electrode, base electrodes, and collector electrodes are formed, by using a known lift-off process, as shown in FIG. 2. In forming the emitter electrode, Si$_3$N$_4$ layer 24 and SiO$_2$ layer 23 can be used as a mask for the selective epitaxial growth of the n type AlGaAs layer 6.

In accordance with the first embodiment, the base and emitter layers are formed on the sloped or inclined plane portions of collectors $2_1$ and $2_2$. Thus, the area of the substrate occupied by the HJBTs in accordance with the present invention is less than conventional HJBTs. Accordingly, smaller devices and higher integration can be achieved with the present invention. Moreover, since the HJBTs in accordance with the present invention are smaller, they can be placed closer together than conventional HJBTs. Accordingly, localized deviations in the substrate similarly affect both transistors of the HJBT pair such that both transistors have similar or uniform characteristics. In contrast, conventional HJBTs occupy a larger area and therefore such localized deviations may alter the characteristics of one transistor of the pair and not the other, resulting in non-uniform characteristics.

Figure 4:
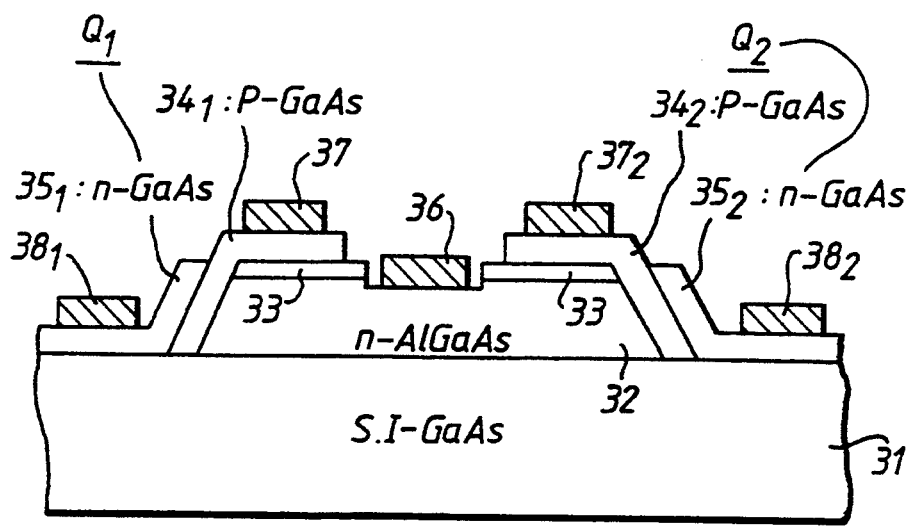
FIG. 4 is a cross-sectional view of a heterojunction bipolar transistor in accordance with a second embodiment of the present invention.

FIG. 4 shows a cross-sectional view of a pair of heterojunction bipolar transistors $Q_1$ and $Q_2$ of a second embodiment of the present invention.

In the second embodiment, an n type AlGaAs layer 32 serves as a common emitter layer and is formed on a semi-insulating GaAs substrate 31. N type AlGaAs layer 32 is covered by an intrinsic (i) type GaAs layer 33. N type AlGaAs layer 32 is patterned by a wet etch of a phosphoric acid liquid system to form an island having inclined plane or sloped edge portions. The angle of the inclined planes is controlled by the conditions of the wet etch, as in the first embodiment. P type GaAs base layers $34_1$ and $34_2$ are formed on opposite sides of the edge portion. In addition, n type GaAs collector layers $35_1$ and $35_2$ are formed so as to overlap with p type GaAs base layer on the inclined plane. Base layers $34_1$ and $34_2$ and collector layers $35_1$ and $35_2$ are formed in a manner similar to that of the first embodiment.

A center portion i type layer 33 is selectively etched to expose the surface of n-type AlGaAs emitter layer 32. Then an emitter electrode 36 is formed on the etched center portion. Base electrodes $37_1$ and $37_2$ and collector electrodes $38_1$ and $38_2$ are respectively formed on p type base layers $34_1$ and $34_2$ and n type collector layers $35_1$ and $35_2$.

According to the second embodiment, similar advantages as the first embodiment can be obtained. Moreover, according to the second embodiment, n type AlGaAs emitter layer 32 is initially formed on a flat substrate 31. Therefore, n type AlGaAs emitter layer 32 has few crystalline defects and thus a good and a reliable heterojunction bipolar can be manufactured.

Figure 5A:
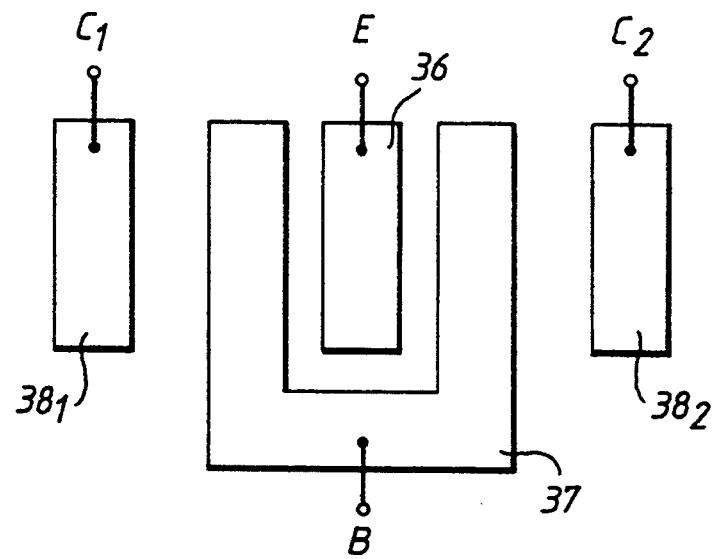
FIG. 5(a) is a plan view of a third embodiment of the present invention.
Figures 5B, 5C:
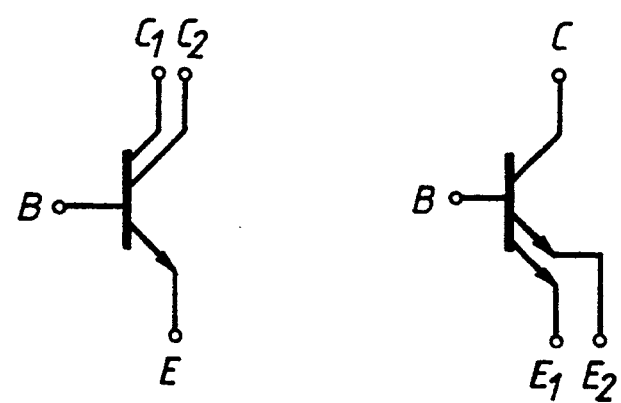
FIGS. 5(b) and 5(c) are equivalent circuit diagrams describing the third embodiment.

In the second embodiment, if base layers $34_1$ and $34_2$ are electrically connected to each other or formed as one body, a multi-collector HJBT structure can be obtained. FIG. 5(a) shows a plan view or layout of such a multi-collector heterojunction transistor structure. FIG. 5(b) shows an equivalent circuit of the heterojunction transistor shown in FIG. 5(a).

Alternatively, a multi-emitter heterojunction transistor can be obtained if region 32 is formed as a collector and region 5 with collectors $38_1$ and $38_2$ are formed as emitters. FIG. 5(c) shows an equivalent circuit of this device.

In the above embodiments, an AlGaAs/GaAs system is used, but the present invention is not limited to these materials. Other compound semiconductor materials or elemental semiconductor materials can also be used.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor device comprising:
   a substrate having a primary surface;
   a first heterojunction bipolar transistor formed on the primary surface of said substrate including:
      a first layer having a first conductivity type, said first layer having a surface sloped relative to the primary surface of said substrate; and
      a second layer having a second conductivity type being formed on the sloped surface of said first layer;
   a second heterojunction bipolar transistor formed on the primary surface of said substrate including:
      a first layer having a first conductivity type, said first layer having a surface sloped relative to the primary surface of said substrate; and
      a second layer having a second conductivity type being formed on the sloped surface of said first layer; and
   a semiconductor region being formed on the primary surface of said substrate, said semiconductor region having a first portion in contact with said second layer of said first heterojunction bipolar transistor and a second portion in contact with said second layer of said second heterojunction bipolar transistor.

2. A semiconductor device according to claim 1 wherein the sloped surface of said first layer of said first heterojunction bipolar transistor is formed opposite the sloped surface of said first layer of said second heterojunction bipolar transistor.

3. A semiconductor device comprising:
   a substrate primary surface having a primary surface;
   a first heterojunction bipolar transistor including:
      a first layer having a first conductivity type; and
      a second layer having a second conductivity type being
      formed in contact with said first layer;
   a second heterojunction bipolar transistor including:
      a first layer having the first conductivity type; and
      a second layer having the second conductivity type being formed in contact with said first layer;
   an island semiconductor layer having the first semiconductor type and being formed on said semiconductor substrate, said island semiconductor layer having a first sloped surface and a second sloped surface,
   wherein the first sloped surface of said island semiconductor layer being formed in contact with said second layer of said first heterojunction bipolar transistor, and the second sloped surface being formed in contact with said second layer of said second heterojunction bipolar transistor.

4. A semiconductor device according to claim 3, wherein said second layer of said first heterojunction bipolar transistor being electrically connected to said second layer of said second heterojunction bipolar transistor.

5. A semiconductor device according to claim 3, wherein said second layer of said first heterojunction bipolar transistor and said second layer of said second heterojunction bipolar transistor are formed as one body.

6. A semiconductor device comprising:
   a substrate;
   a first sloped semiconductor region having a first conductivity type formed on said substrate;
   a second sloped semiconductor region having the first conductivity type formed on said substrate;
   a third semiconductor region having a second conductivity type formed in contact with said first sloped semiconductor region;
   a fourth semiconductor region having the second conductivity type formed in contact with said second sloped semiconductor region; and a fifth semiconductor region having the first conductivity type formed in contact with said third semiconductor region and said fourth region; wherein said first sloped semiconductor region constitutes at least a portion of a collector of a first bipolar transistor, said third semiconductor region constitutes at least a portion of a base of the first bipolar transistor, said second sloped semiconductor region constitutes at least a portion of a collector of a second bipolar transistor, said fourth semiconductor region constitutes at least a portion of a base of the second bipolar transistor, and said fifth semiconductor region constitutes at least a portion of an emitter layer common to both of said first and second bipolar transistors.

7. A semiconductor device comprising:

a substrate;

a first sloped semiconductor region having a first conductivity type formed on said substrate;

a second sloped semiconductor region having the first conductivity type formed on said substrate;

a third semiconductor region having a second conductivity type formed in contact with said first sloped semiconductor region;

a fourth semiconductor region having the second conductivity type formed in contact with said second sloped semiconductor region;

a fifth semiconductor region having the first conductivity type formed in contact with said third semiconductor region and said fourth region;

wherein said first sloped semiconductor region constitutes at least a portion of an emitter of a first bipolar transistor, said third semiconductor region constitutes at least a portion of a base of the first bipolar transistor, said second sloped semiconductor region constitutes at least a portion of an emitter of a second bipolar transistor, said fourth semiconductor region constitutes at least a portion of a base of the second bipolar transistor, and said fifth semiconductor region constitutes at least a portion of a collector layer common to both of the first and the second bipolar transistors.

* * * * *